US007950407B2

(12) United States Patent
Mimken et al.

(10) Patent No.: US 7,950,407 B2
(45) Date of Patent: May 31, 2011

(54) APPARATUS FOR RAPID FILLING OF A PROCESSING VOLUME

(75) Inventors: Victor Burton Mimken, Boise, ID (US); Robert Tolles, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1129 days.

(21) Appl. No.: 11/672,254

(22) Filed: Feb. 7, 2007

(65) Prior Publication Data
US 2008/0185018 A1 Aug. 7, 2008

(51) Int. Cl.
*B67D 3/00* (2006.01)
(52) U.S. Cl. .......................................... 137/14; 137/240
(58) Field of Classification Search ............... 137/15.04, 137/15.05, 240, 14
See application file for complete search history.

(56) References Cited

U.S. PATENT DOCUMENTS

| | | |
|---|---|---|
| 1,927,677 A | 1/1927 | Bennington |
| 3,206,041 A | 9/1965 | McGrath |
| 3,351,219 A | 11/1967 | Ruderfer |
| 3,402,835 A | 9/1968 | Saul |
| 3,610,159 A | 10/1971 | Fickenscher |
| 3,750,804 A | 8/1973 | Lemelson |
| 3,796,327 A | 3/1974 | Meyer et al. |
| 3,876,085 A | 4/1975 | Bright |
| 4,027,246 A | 5/1977 | Caccoma et al. |
| 4,830,888 A | 5/1989 | Kobayashi et al. |
| 4,846,623 A | 7/1989 | Otani et al. |
| 4,911,761 A | 3/1990 | McConnell et al. |
| 4,923,054 A | 5/1990 | Ohtani et al. |
| 4,984,597 A | 1/1991 | McConnell et al. |
| 5,054,332 A | 10/1991 | Terauchi et al. |
| 5,061,144 A | 10/1991 | Akimoto et al. |
| 5,197,846 A | 3/1993 | Uno et al. |
| 5,308,210 A | 5/1994 | Ohtani et al. |
| 5,339,128 A | 8/1994 | Tateyama et al. |
| 5,359,785 A | 11/1994 | Fukutomi et al. |
| 5,386,927 A * | 2/1995 | Janssen .............................. 222/1 |
| 5,415,890 A | 5/1995 | Kloiber et al. |
| 5,416,047 A | 5/1995 | Konishi et al. |
| 5,430,271 A | 7/1995 | Orgami et al. |
| 5,436,848 A | 7/1995 | Nishida et al. |
| 5,443,348 A | 8/1995 | Biche et al. |
| 5,485,644 A | 1/1996 | Shinbara et al. |
| 5,571,325 A | 11/1996 | Ueyama et al. |
| 5,634,377 A | 6/1997 | Kimura et al. |
| 5,639,301 A | 6/1997 | Sasada et al. |
| 5,651,823 A | 7/1997 | Parodi et al. |
| 5,665,200 A | 9/1997 | Fujimoto et al. |
| 5,668,733 A | 9/1997 | Morimoto et al. |
| 5,687,085 A | 11/1997 | Morimoto et al. |
| 5,700,046 A | 12/1997 | Van Doren et al. |
| 5,701,627 A | 12/1997 | Matsumura et al. |

(Continued)

*Primary Examiner* — Kevin L Lee
(74) *Attorney, Agent, or Firm* — Patterson & Sheridan, L.L.P.

(57) ABSTRACT

A method and apparatus for supplying greater fluid flow and/or fluid volume from a fluid provided from a facility source to a substrate processing chamber is provided. The apparatus couples to an existing facility fluid source and accumulates the fluid, and the flow characteristics of the accumulated fluid are enhanced for delivery to the processing chamber. The apparatus includes a tank in fluid communication with the facility source and one or more processing chambers, and a valve disposed between the tank and the processing chambers adapted to receive a signal from a controller to facilitate filling or draining of the tank. The apparatus and method affects cost of ownership by altering the pressure and/or volume of the existing facility source without the need to alter the facility source.

9 Claims, 7 Drawing Sheets

U.S. PATENT DOCUMENTS

| | | |
|---|---|---|
| 5,730,574 A | 3/1998 | Adachi et al. |
| 5,733,024 A | 3/1998 | Slocum et al. |
| 5,762,745 A | 6/1998 | Hirose |
| 5,766,824 A | 6/1998 | Batchelder et al. |
| 5,788,868 A | 8/1998 | Itaba et al. |
| 5,803,932 A | 9/1998 | Akimoto et al. |
| 5,823,736 A | 10/1998 | Matsumura |
| 5,838,121 A | 11/1998 | Fairbairn et al. |
| 5,875,804 A | 3/1999 | Tanaka et al. |
| 5,884,640 A | 3/1999 | Fishkin et al. |
| 5,915,396 A | 6/1999 | Kinose |
| 5,919,529 A | 7/1999 | Matsumura |
| 5,921,257 A | 7/1999 | Weber et al. |
| 5,935,768 A | 8/1999 | Biche et al. |
| 5,943,880 A | 8/1999 | Tateyama |
| 5,944,043 A * | 8/1999 | Glick et al. ............... 137/240 |
| 5,960,225 A | 9/1999 | Fujimoto |
| 5,963,753 A | 10/1999 | Ohtani et al. |
| 5,970,717 A | 10/1999 | Tateyama |
| 5,974,682 A | 11/1999 | Akimoto |
| 5,989,346 A | 11/1999 | Hiroki |
| 5,992,431 A | 11/1999 | Weber et al. |
| 6,004,047 A | 12/1999 | Akimoto et al. |
| 6,012,192 A | 1/2000 | Sawada et al. |
| 6,021,790 A | 2/2000 | Yoshitani et al. |
| 6,026,986 A * | 2/2000 | Choi et al. ............... 222/64 |
| 6,027,574 A | 2/2000 | Fishkin et al. |
| 6,051,101 A | 4/2000 | Ohtani et al. |
| 6,063,439 A | 5/2000 | Semba et al. |
| 6,074,515 A | 6/2000 | Iseki et al. |
| 6,076,652 A | 6/2000 | Head, III |
| 6,077,321 A | 6/2000 | Adachi et al. |
| 6,099,643 A | 8/2000 | Ohtani et al. |
| 6,108,932 A | 8/2000 | Chai |
| 6,128,829 A | 10/2000 | Wolke et al. |
| 6,138,695 A | 10/2000 | Shibao et al. |
| 6,142,722 A | 11/2000 | Genov et al. |
| 6,143,087 A | 11/2000 | Walter |
| 6,155,275 A | 12/2000 | Shinbara |
| 6,176,667 B1 | 1/2001 | Fairbairn et al. |
| 6,251,195 B1 | 6/2001 | Wagener et al. |
| 6,253,118 B1 | 6/2001 | Koyama |
| 6,261,007 B1 | 7/2001 | Takamori et al. |
| 6,292,250 B1 | 9/2001 | Matsuyama |
| 6,293,719 B1 | 9/2001 | Ueda |
| 6,313,903 B1 | 11/2001 | Ogata |
| 6,318,948 B1 | 11/2001 | Ueda et al. |
| 6,328,814 B1 | 12/2001 | Fishkin et al. |
| 6,348,101 B1 | 2/2002 | Walter |
| 6,371,713 B1 | 4/2002 | Nishimura et al. |
| 6,379,056 B1 | 4/2002 | Ueda |
| 6,402,400 B1 | 6/2002 | Ueda et al. |
| 6,402,508 B2 | 6/2002 | Harada et al. |
| 6,403,924 B1 | 6/2002 | Hayashi |
| 6,438,449 B2 | 8/2002 | Kawamatsu et al. |
| 6,444,029 B1 | 9/2002 | Kimura et al. |
| 6,446,646 B1 | 9/2002 | Izumi |
| 6,454,332 B1 | 9/2002 | Govzman et al. |
| 6,464,789 B1 | 10/2002 | Akimoto |
| 6,471,422 B1 | 10/2002 | Ueda et al. |
| 6,475,279 B1 | 11/2002 | Akimoto |
| 6,491,491 B1 | 12/2002 | Tsuneda et al. |
| 6,491,763 B2 * | 12/2002 | Verhaverbeke et al. ........ 134/26 |
| 6,507,770 B2 | 1/2003 | Tateyama et al. |
| 6,511,315 B2 | 1/2003 | Hashimoto |
| 6,526,329 B2 | 2/2003 | Tateyama et al. |
| 6,533,531 B1 | 3/2003 | Nguyen et al. |
| 6,539,956 B1 | 4/2003 | Wolke et al. |
| 6,556,893 B2 | 4/2003 | Kumar et al. |
| 6,568,847 B2 | 5/2003 | Nishijima et al. |
| 6,575,177 B1 | 6/2003 | Brown et al. |
| 6,616,394 B1 | 9/2003 | Park |
| 6,616,762 B2 | 9/2003 | Inada et al. |
| 6,658,053 B1 | 12/2003 | Aiello et al. |
| 6,659,661 B2 | 12/2003 | Deguchi et al. |
| 6,672,779 B2 | 1/2004 | Ueda et al. |
| 6,676,757 B2 | 1/2004 | Kitano et al. |
| 6,691,430 B2 | 2/2004 | Saito et al. |
| 6,694,224 B2 | 2/2004 | Ramanan |
| 6,703,316 B2 | 3/2004 | Inoue et al. |
| 6,712,579 B2 | 3/2004 | Fujii et al. |
| 6,713,239 B2 | 3/2004 | Toshima et al. |
| 6,726,848 B2 | 4/2004 | Hansen et al. |
| 6,736,556 B2 | 5/2004 | Kanagawa |
| 6,746,544 B2 | 6/2004 | Fishkin et al. |
| 6,752,543 B2 | 6/2004 | Fukutomi et al. |
| 6,790,286 B2 | 9/2004 | Nishimura et al. |
| 6,790,287 B2 | 9/2004 | Shiga et al. |
| 6,790,291 B2 | 9/2004 | Kimura |
| 6,822,413 B2 | 11/2004 | Simondet |
| 6,832,863 B2 | 12/2004 | Sugimoto et al. |
| 6,834,210 B2 | 12/2004 | Tateyama et al. |
| 6,837,632 B2 | 1/2005 | Koyama et al. |
| 6,841,031 B2 | 1/2005 | Iwata et al. |
| 6,851,872 B1 | 2/2005 | Okubo et al. |
| 6,868,888 B2 | 3/2005 | Adachi |
| 6,893,171 B2 | 5/2005 | Fukutomi et al. |
| 6,955,516 B2 | 10/2005 | Achkire et al. |
| 2001/0024691 A1 | 9/2001 | Kimura et al. |
| 2003/0200988 A1 | 10/2003 | Brown et al. |
| 2004/0055625 A1 | 3/2004 | Fishkin et al. |
| 2004/0091349 A1 | 5/2004 | Tabrizi et al. |
| 2005/0229426 A1 | 10/2005 | Achkire et al. |
| 2005/0241684 A1 | 11/2005 | Achkire et al. |
| 2008/0166208 A1 | 7/2008 | Lester et al. |
| 2009/0029560 A1 | 1/2009 | Hansen et al. |

* cited by examiner

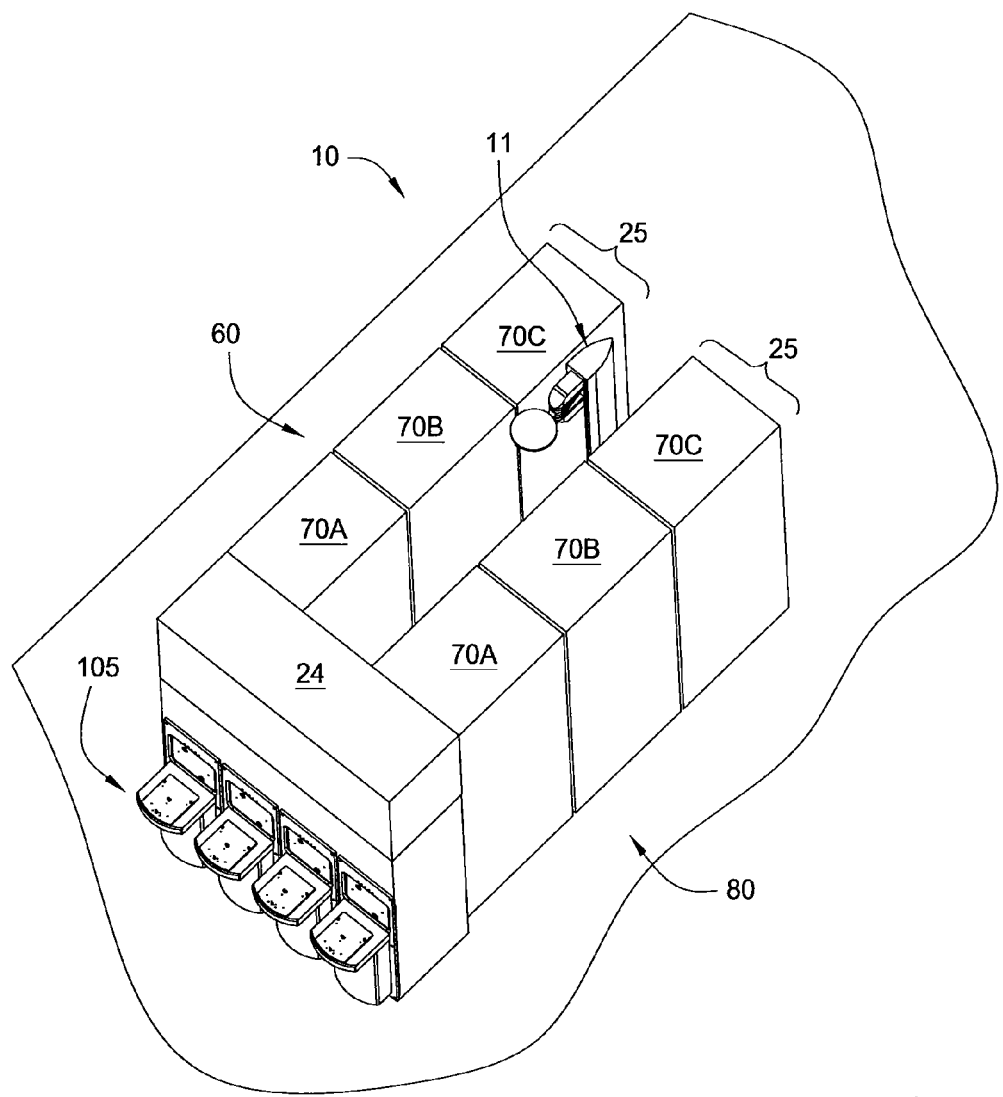
FIG. 1
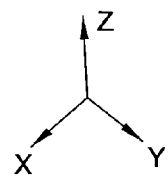

APPARATUS FOR RAPID FILLING OF A PROCESSING VOLUME

BACKGROUND OF THE INVENTION

1. Field of the Invention

Embodiments of the present invention generally relate to a method and apparatus for cleaning and/or preparing a surface of a substrate, such as a semiconductor wafer. More specifically, to an apparatus and method of rapidly filling a processing volume of a chamber for cleaning and/or preparing the substrate surface.

2. Description of the Related Art

During the fabrication of semiconductor substrates, multiple cleaning steps are typically required to remove impurities from the surfaces of the substrates before subsequent processing and high levels of cleanliness are generally required during the cleaning of semiconductor substrates. The cleaning of a substrate, also known as surface preparation, typically includes subjecting the substrate to a sequence of chemical treatment and rinse steps and eventually to a final drying step. A typical cleaning/surface preparation procedure may include etch, clean, rinse and dry steps. During a typical cleaning step, the substrates are exposed to a cleaning solution that may include water, ammonia ($NH_3$), hydrofluoric acid (HF) or hydrochloric acid (HCl), and hydrogen peroxide ($H_2O_2$). After cleaning, the substrates are rinsed using ultra-pure water, such as de-ionized (DI) water, and then dried using one of several known drying processes.

In some cases, various substrate cleaning/surface preparation processes are advantageously performed using a chamber sized to receive and process a single substrate, or sized to receive and process no more than two substrates at a time. Multiple chambers may be mounted on a tool or platform so that multiple single substrates, or multiple pairs of substrates can be processed at one time. Chemicals and processes may be monitored more efficiently to assure more uniform processing of each substrate, or pair of substrates. The substrate or substrates may be processed in a vertical orientation, wherein the typical processing surface(s) of the substrate(s) face a horizontal direction, as described in U.S. patent application Ser. No. 11/620,610, to Lester, et al., entitled "Wet Clean System Design," filed Jan. 5, 2007.

The multiple chamber configuration on the platform generally requires a high fluid volume to fill each of the chambers. Typically, at least a portion of the fluids, such as DI water, are supplied by a DI water source located in the manufacturing facility, and the DI water source may not have the capacity to keep up with the fluid demand. For example, each chamber may require between about 35 liters per minute (LPM) to about 45 LPM to fill the volume of each chamber. Additional chambers on the platform, which may be operating in parallel, may increase the fluid demand. Thus, the facility source may not be able to provide the needed flow rate and/or flow pressure to fill the chambers. Further, rapid filling of the chambers may require even higher flow rates and pressures.

What is needed is an apparatus to facilitate rapid filling of the chambers using the facility pressure and flow rate.

SUMMARY OF THE INVENTION

The present invention generally describes a method and apparatus for supplying greater fluid flow and/or fluid volume of a fluid provided from a facility source to a substrate processing chamber. The apparatus couples to an existing facility fluid source and accumulates the fluid, and the flow characteristics of the accumulated fluid are enhanced for delivery to the processing chamber. The apparatus includes a tank in fluid communication with the facility source and one or more processing chambers, and a valve disposed between the tank and the processing chambers adapted to receive a signal from a controller to facilitate filling or draining of the tank. The apparatus and method affects cost of ownership by altering the pressure and/or volume of the existing facility source without the need to alter the facility source.

In one embodiment, a fluid delivery system for a semiconductor processing chamber located in a manufacturing facility is described. The fluid delivery system includes a supply conduit having a first end and a second end, the first end coupled to a de-ionized water source provided by the manufacturing facility and the second end coupled to the processing chamber, a tank coupled to the supply conduit between the de-ionized water source and the processing chamber by a fill/drain conduit, a valve coupled to the supply conduit between the fill/drain conduit and the processing chamber, and a controller coupled to the valve.

In another embodiment, a fluid delivery system for a semiconductor processing system is described. The fluid delivery system includes a supply conduit having a first end and a second end, the first end coupled to a de-ionized water source provided by the manufacturing facility and the second end coupled to a processing chamber array, a tank coupled to the supply conduit between the de-ionized water source and the processing chamber array by a fill/drain conduit, a first valve coupled to the supply conduit between the fill/drain conduit and the processing chamber, and a controller coupled to the valve.

In another embodiment, a method of supplying a fluid to a substrate processing apparatus is described. The method includes providing a pressure vessel coupled to a facility fluid source, flowing a fluid from the facility fluid source to the pressure vessel, accumulating a volume of the fluid from the facility fluid source in the pressure vessel to form a pressure in a head volume above the fluid, the pressure substantially equal to a pressure of the facility fluid source, and opening a first valve by a signal from a controller to release at least a portion of the volume of fluid from the pressure vessel to one or more processing chambers located on the substrate processing apparatus.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is an isometric view of one embodiment of a substrate cleaning/surface preparation platform.

DETAILED DESCRIPTION

Figure 2:
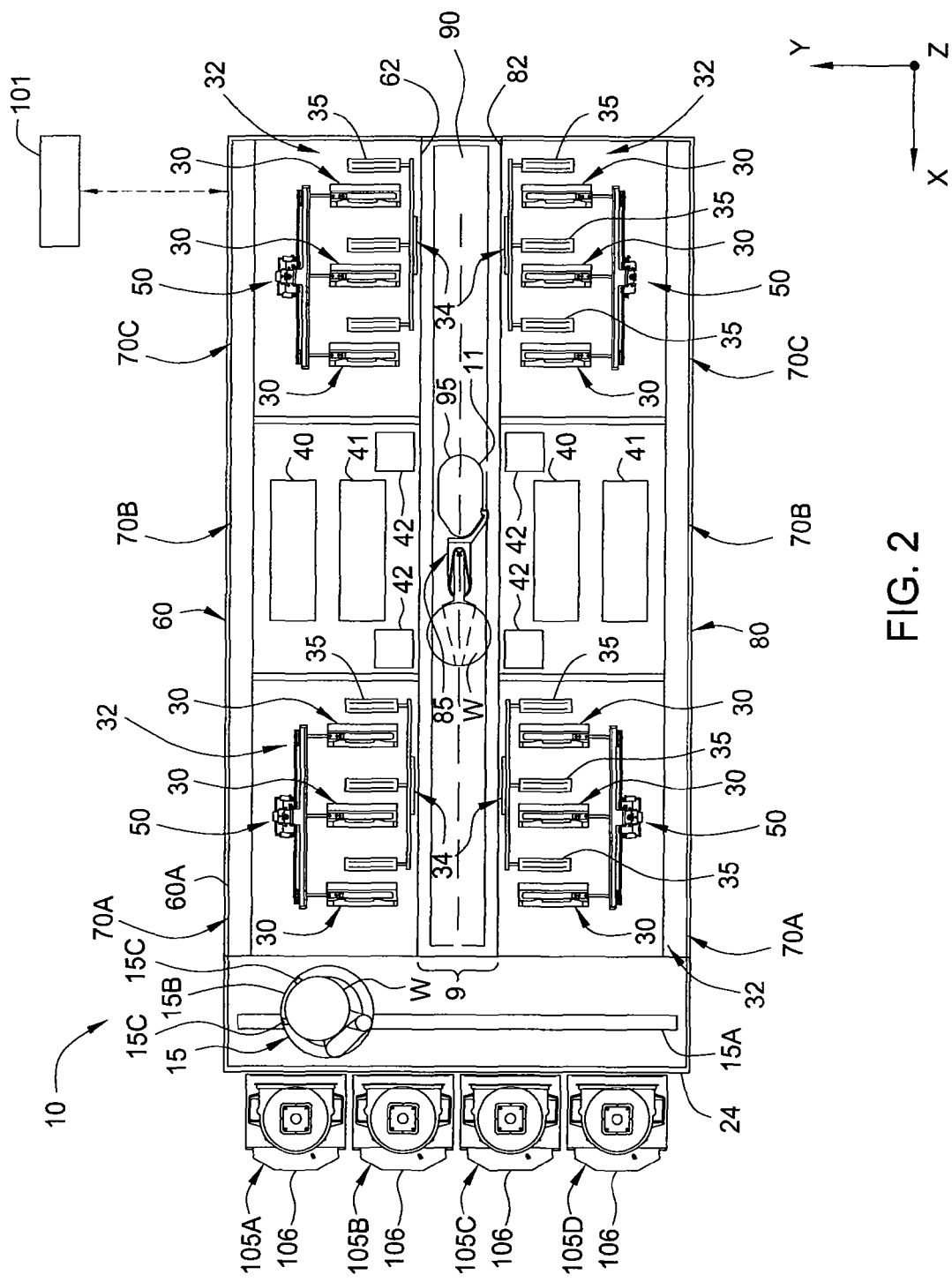
FIG. 2 is a top plan view of the platform shown in FIG. 1.

The present invention relates to embodiments of chambers for processing a single substrate and associated processes with embodiments of the chambers. The chambers and methods of the present invention may be configured to perform substrate surface cleaning/surface preparation processes, such as etching, cleaning, rinsing and/or drying a single substrate. Etching process chemicals may include selective etchants and non-selective ethants (NSE), buffered etchants (LAL as one example), a buffered oxide etchant (BOE), among others. Hydrofluoric acid (HF) and hydrochloric acid (HCl) may also be used. Cleaning chemicals may include hydrogen peroxide, standard clean 1 (SC1), standard clean 2 (SC2), RCA, an ammonia/peroxide mixture (APM), AM1 chemistry (available from Applied Materials, Inc., of Santa Clara, Calif.), among other cleaning solutions and chemicals. Rinsing agents include water, such as de-ionized (DI) water, among other rinsing agents.

FIG. 1 is an isometric view of one embodiment of a platform or tool 10 that is adapted to clean and/or prepare a surface of a substrate. The tool 10 includes a front end module 24 and a central module 25. The central module 25 generally contains a first processing rack 60, a second processing rack 80, and one or more robot assemblies 11 that are adapted to access the various process chambers positioned in the first processing rack 60 and the second processing rack 80. The front end module 24 generally contains one or more pod assemblies 105, or front-end opening unified pods (FOUPs), which are generally adapted to accept one or more cassettes (shown in FIG. 2) that may contain one or more substrates, or wafers, that are to be processed in the tool 10. An exemplary tool may be found in the description FIGS. 1A-1D and 1F of U.S. patent application Ser. No. 11/620,610, to Lester, et al., entitled "Wet Clean System Design," filed Jan. 5, 2007, which is incorporated by reference in its entirety.

Figure 3:
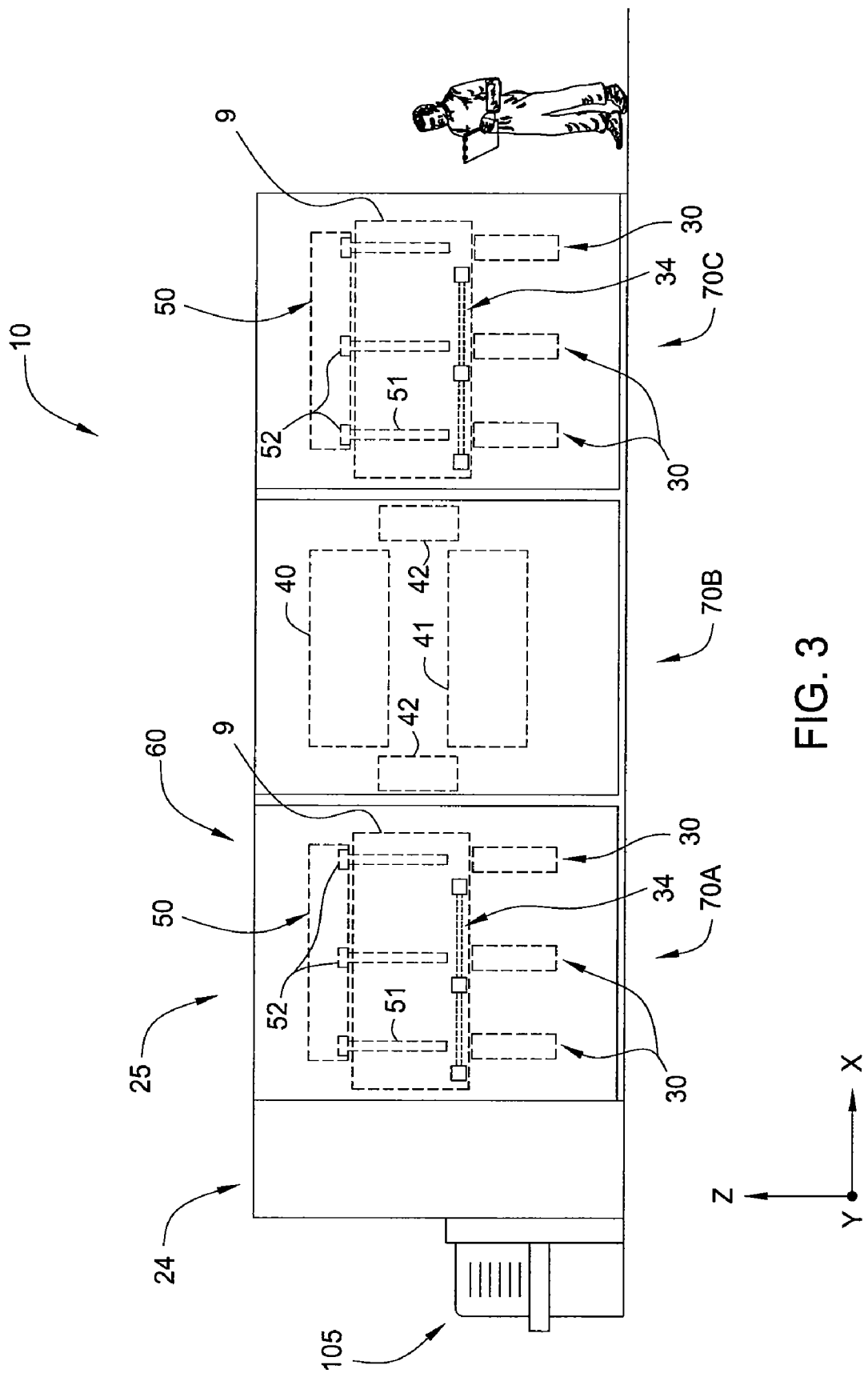
FIG. 3 is a side view of the platform shown in FIG. 2.

The first processing rack 60 and second processing rack 80 may contain one or more modules 70A-70C that contain process chambers and/or process chamber support hardware. One embodiment of the tool 10 includes, as illustrated in FIGS. 2 and 3, the first processing rack 60 and the second processing rack 80, which contains various processing chambers (e.g., process chambers 30 (FIG. 2)) that are adapted to perform the various processing steps found in a substrate processing sequence. In one embodiment, the first processing rack 60 and second processing rack 80 include one or more processing chambers that can be adapted to perform one or more cleaning processing sequence steps.

FIG. 2 is a top plan view of the embodiment of the tool 10 shown in FIG. 1. The front end module 24 generally contains one or more pod assemblies 105A-105D and a front end robot assembly 15. The one or more pod assemblies 105, or FOUPs, are generally adapted to accept one or more cassettes 106 that may contain one or more substrates "W" that are to be processed in the tool 10. In one embodiment, the cassettes are adapted to retain the one or more substrates in horizontal orientation (i.e., processing surface, or surface on which the semiconductor devices are formed, is facing up or facing down). In one aspect, the front end module 24 also contains one or more pass-through positions 9 that allow the front end robot assembly 15 and the robot assembly 11 in the central module 25 to exchange substrates.

FIGS. 2 and 3 illustrate one embodiment of the tool 10 that has a first processing rack 60 and a second processing rack 80 (only the first processing rack 60 is shown in FIG. 3). The processing racks 60, 80 include one or more modules (e.g., reference numerals 70A-70C) that either contain processing chambers or supporting equipment. In this embodiment, each processing rack 60, 80 contains two processing chamber arrays 32, and each processing chamber array 32 includes a total of three process chambers 30. In the configuration shown, modules 70A and 70C each contain three process chambers 30 that are positioned along a desirable direction (i.e., X-direction) and module 70B contains the process supporting components, such as the fluid delivery systems 40-42. The orientation, positioning, type, and number of process chambers shown in the FIGS. 2 and 3 are not intended to be limiting as to the scope of the invention, but are intended to illustrate an embodiment of the invention.

Referring to FIG. 2, in one embodiment, the front end robot assembly 15 is adapted to transfer substrates between the cassette 106 mounted in the pod assembly 105 (see elements 105A-D) and the one or more of the pass-through positions 9. The front end robot assembly 15 generally contains a horizontal motion assembly 15A and a robot 15B, which in combination are able to position a substrate W in a desired horizontal and/or vertical position in the front end module 24 or suitable positions in the central module 25. The front end robot assembly 15 is adapted to transfer one or more substrates W using one or more robot blades 15C, by use commands sent from a system controller 101 (discussed below). In one sequence, the front end robot assembly 15 is adapted to transfer a substrate from the cassette 106 to the pass-through position 9. Generally, a pass-through position is a substrate staging area that may contain a pass-through processing chamber that is similar to a conventional substrate cassette 106, which is able to accept one or more substrates from a front end robot 15B so that it can be removed and repositioned by the robot assembly 11.

A system controller 101 is used to control the front-end robot 15, the first robot assembly 11, and other supporting hardware, so that the substrate W can be transferred to the various processing chambers contained in the first processing rack 60 and the second processing rack 80. In one embodiment, the modules 70A and 70C each contain a chamber pass-through assembly 34 and an actuator assembly 50 that is adapted to interface with the robot assembly 11. In this configuration, as shown in FIGS. 2 and 3, the substrates are transferred from the pass-through position 9 by the robot assembly 11 to the chamber pass-through assembly 34. The system controller 101 is adapted to control the position and motion of the various components used to complete the transferring process. The system controller 101 is generally designed to facilitate the control and automation of the overall system and typically includes a central processing unit (CPU) (not shown), memory (not shown), and support circuits (or I/O) (not shown). The CPU may be one of any form of computer processors that are used in industrial settings for controlling various system functions, chamber processes and support hardware (e.g., detectors, robots, motors, fluid delivery hardware, gas sources hardware, etc.) and monitor the system and chamber processes (e.g., chamber temperature, process sequence throughput, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 101 determines which tasks are performable on a substrate. Preferably, the program is software readable by the system controller 101, which includes code to perform tasks relating to monitoring and execution of the processing sequence tasks and various chamber process recipe steps.

The robot assembly 11 is adapted to transfer substrates and position substrates in a horizontal, vertical, or angular orientation to facilitate transfer of substrates between various positions within the tool 10. The ability to position and angularly orient a substrate using a robot assembly 11 is generally completed by cooperative movement of the components contained in a horizontal motion assembly 90, a vertical motion assembly 95, and robot hardware assembly 85, which may include a supinating robot blade assembly, facilitated by commands sent from the system controller 101. In one aspect, the side 62 of the first processing rack 60, and the side 82 of the second processing rack 80 are both aligned along a direction parallel to the horizontal motion assembly 90 (described below) of the robot assembly 11.

Each of the processing chamber arrays 32 include an actuator assembly 50 and an end-effector assembly 52 adapted to receive and transfer one or more substrates to and from the processing chambers 30 in each chamber array 32. The actuator assembly 50, which is positioned so that it can communicate with the chamber pass-through assemblies 34, is adapted to position a substrate W in a processing chamber 30. In one embodiment, the robot assembly 11 is adapted to pick-up, transfer, and receive substrates from each of the chamber pass-through supports 35 contained in the chamber pass-through assembly 34 so that the end-effector assembly 52 in the actuator assembly 50 can pickup and position a substrate in the processing chamber 30. In one aspect of the transferring process, the robot assembly 11 is adapted to deposit a substrate in position 36A (FIG. 4) of the chamber pass-through 35 before it is picked-up and positioned in the process chamber 30 by the end-effector assemblies 52. Additional details of the robot assembly 11 and other aspects of the transfer sequence between the processing chambers 30 and the robot assembly 11 can be found in the description of FIGS. 5A-8G of U.S. patent application Ser. No. 11/620,610, to Lester, et al., entitled "Wet Clean System Design," filed Jan. 5, 2007, which was previously incorporated by reference.

FIG. 3 illustrates a side view of one embodiment of the first processing rack 60 as viewed when facing the first processing rack 60 from outside of the tool 10. Although not shown, the second processing rack 80 may be similar in design and function to the first processing rack 60. The first processing rack 60 generally contains one or more processing chambers 30 that are adapted to perform some desired semiconductor or flat panel display device fabrication processing steps on a substrate. For example, in FIG. 3, the modules 70A and 70C of the first processing rack 60 contains three processing chambers 30. In one embodiment, these device fabrication processing steps may include cleaning a surface of the substrate, etching a surface of the substrate, drying a surface of the substrate, or exposing the substrate to some form of radiation to cause a physical or chemical change to one or more regions on the substrate. Although three processing chambers 30 are shown in each of the modules 70A and 70C, any number of processing chambers 30 may be contained in the modules.

Figure 4:
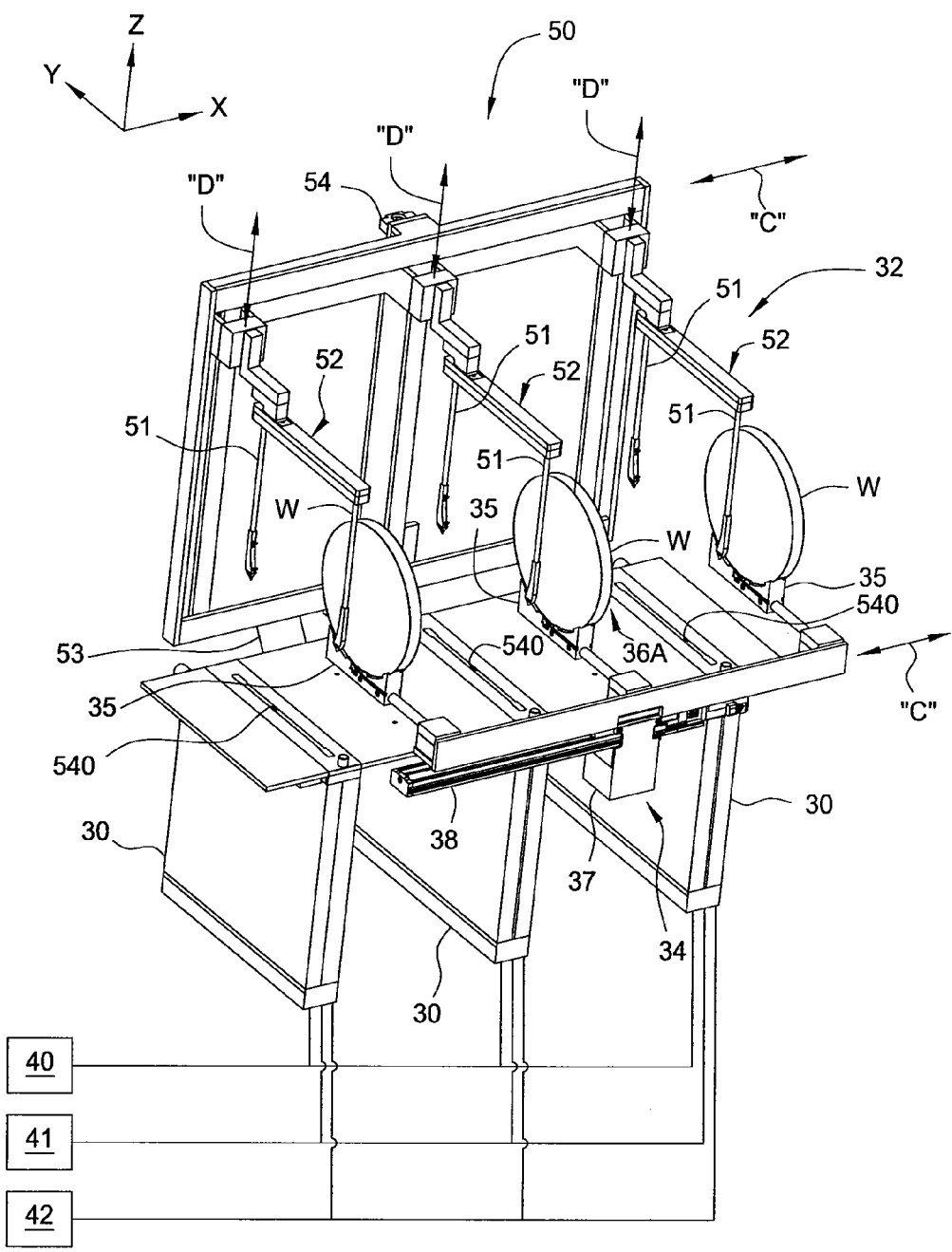
FIG. 4 is an isometric view of one embodiment of a processing chamber array.

FIG. 4 is an isometric view of one embodiment of a processing chamber array 32 that may be found in one or more of the modules 70A-70C in the first processing rack 60 or second processing rack 80. In one embodiment, the processing chamber array 32 contains three processing chambers 30, although the number of processing chambers in the array 32 may be more or less. The processing chamber array 32 also includes a chamber pass-through assembly 34 that contains three chamber pass-through supports 35, and an actuator assembly 50 that has three end-effector assemblies 52. In one example, as shown in FIG. 2-4, the three processing chambers 30 in the processing chamber array 32 are aligned along the X-direction. A pair of end-effector supports 51 on each of the three end-effector assemblies 52 are adapted receive and transfer a substrate from an input slot or an output slot included on the chamber pass-through support 35.

In one embodiment, the robot assembly 11 transfers a substrate to either an input slot or an output slot of the chamber pass-through support 35, and both the input slot and the output slot are adapted to retain the substrate in a vertical orientation to facilitate transfer to the pair of end effector supports 51. The end-effector assembly 52 is then adapted to position the substrates in the processing chambers 30. The chamber pass-through assembly 34 may have an actuator 37 (e.g., DC servomotor, linear motor, air cylinder) and linear slide 38 that are adapted to support, guide and position the three chamber pass-through supports 35 in a position relative to the end-effector assemblies 52 and the robot assembly 11 (not shown in this view) by use of commands from the system controller 101 (FIG. 2). In one embodiment, the chamber pass-through assembly 34 is adapted to move linearly or in direction "C" relative to the robot assembly 11 and/or the end-effector assemblies 52. The actuator assembly 50 may have an actuator 54 (e.g., DC servomotor, linear motor, pneumatic motor) that is coupled to a slide assembly (not shown in this view) that is adapted to support, guide and position the three end-effector assemblies 52 in a position relative to the chamber pass-through supports 35 and the processing chambers 30 by use of the controller 101 (FIG. 2), such as in direction "D". The actuator assembly 50 may also include an actuator 53 (e.g., DC servomotor, linear motor, pneumatic motor) that is coupled to a slide assembly (not shown in this view) that is adapted to support, guide and position the three end-effector assemblies 52 in a position relative to the chamber pass-through supports 35 and the processing chambers 30 by use of the controller 101 (FIG. 2), such as in direction "C". In all embodiments, the actuator assembly 50 is adapted to move the end effector assemblies 52 relative to the processing chambers 30 and/or the chamber pass-through assembly 34, and also facilitates vertical movement of the end-effector assemblies 52 to facilitate processing by lowering and lifting the substrates into and out of the processing chambers 30.

In the embodiment shown in FIG. 4, each of the processing chambers 30 are coupled to a fluid source, such as fluid delivery systems 40-42. The fluid delivery systems 40-42 may be adapted to deliver processing fluids that may include DI water, ammonia ($NH_3$), standard clean 1 (SC1), hydrofluoric acid (HF) or hydrochloric acid (HCl), hydrogen peroxide ($H_2O_2$), among other processing fluids. In one embodiment, the fluid delivery system 40 supplies an etchant, such as HF and the fluid delivery system 41 supplies a cleaning fluid, such as SC1 to each processing chamber 30. A rinse fluid, such as DI water is supplied from the fluid delivery system 42. Each of the fluid delivery systems 40-42 may include supply tanks, valves, and pumps (all not shown) as needed to supply each processing fluid to the processing chambers 30.

The fluid delivery systems 40-42 are configured to rapidly fill the volume of each processing chamber 30. In some embodiments, the fluid delivery system 42, which may supply DI water to the processing chambers 30, is adapted to rapidly fill the volume of each chamber in about 3-4 seconds. This rapid filling of the processing chamber(s) 30 may require between about 35 liters per minute (LPM) to about 45 LPM at about 50 psi to fill each chamber. As the processing chamber arrays 32 include three processing chambers 30, the flow requirement for three chambers is about 105 LPM to about 135 LPM at 50 psi. In a tool, such as the tool 10 depicted in FIGS. 1-3, the flow requirement for twelve chambers is between about 420 LPM to about 540 LPM at 50 psi if the processing chambers 30 are operated in parallel. Once the processing chambers 30 have been rapidly filled, the flow requirements may drop to about 15 LPM to about 25 LPM at 30 psi for a total flow requirement of about 180 LPM to about 300 LPM at 30 psi for a twelve chamber tool.

As mentioned above, the fluid delivery system 42 may be coupled to a manufacturing facility DI water source that may not be able to provide the required volume and flow rate of DI water to each processing chamber 30. Embodiments described herein solve the flow requirement challenge by an apparatus that uses the facility source flow and pressures to enhance the pressures and volumes needed to fill each processing chamber in 3-4 seconds or less, such as about 2 seconds, and will be described in detail in reference to a chamber fill system 600 of FIG. 6.

Figure 5:
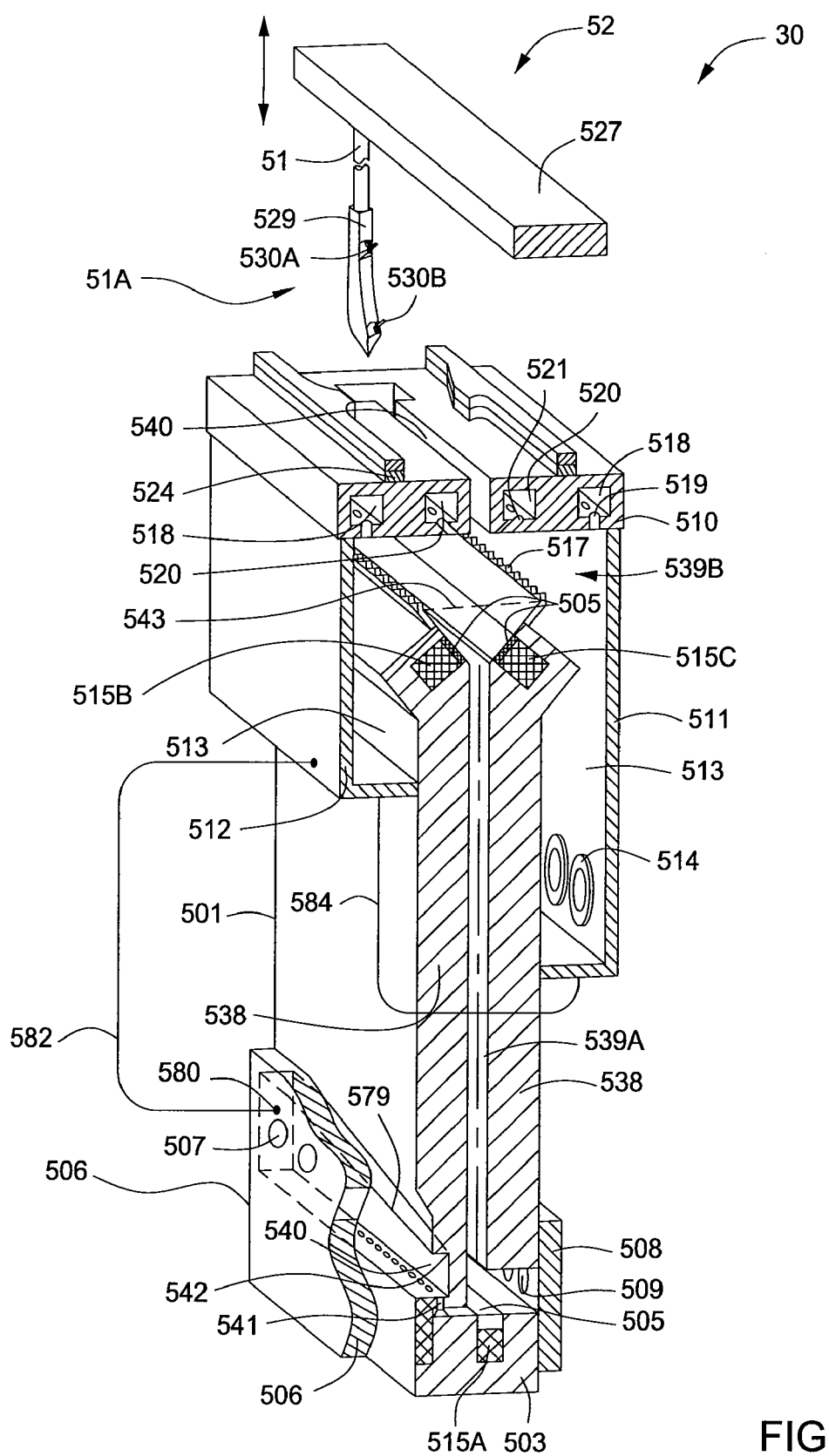
FIG. 5 is an isometric cross sectional view of one embodiment of a substrate processing chamber.

FIG. 5 is an isometric cross sectional view of one embodiment of a substrate processing chamber 30 that may be positioned in processing chamber array 32 as described above. The substrate processing chamber 30 comprises a chamber body 501 configured to retain a fluid, and an end-effector assembly 52 configured to transfer a substrate (not shown) into and out of the chamber body 501. The chamber body 501 generally includes an interior volume, indicated generally as a lower chamber volume 539A and an upper chamber volume 539B, collectively configured as a liquid and/or a vapor processing environment. More specifically, the lower chamber volume 539A is configured as a liquid processing environment, and the upper chamber volume 539B is configured as a vapor processing environment.

The lower portion of the chamber body 501 generally comprises side walls 538 and a bottom wall 503 defining the lower chamber volume 539A. The lower chamber volume 539A may have a rectangular shape configured and sized to retain fluid for immersing a substrate therein. The upper chamber volume 539B generally comprises a chamber lid 510 having an opening 540 formed therein, and an area below the lid 510 and above the lower chamber volume 539A. The opening 540 is configured to allow the end-effector assembly 52 to transfer at least one substrate in and out the chamber body 501. A weir 517 is formed on top of the side walls 538 to contain and allow fluid from the lower chamber volume 539A to overflow. The upper portion of the chamber body 501 includes overflow members 511 and 512 configured to collect fluid flowing over the weir 517 from the lower chamber volume 539A. Each of the overflow members 511, 512 may be coupled together by a conduit 584 between overflow member 512 to overflow member 511, that is configured to allow fluid to drain from overflow member 512 to overflow member 511. The coupling of the overflow members 511, 512 allows all fluid to be collected at a common location, which in this embodiment is the lower portion of overflow member 511.

An inlet manifold 542 is formed on the sidewall 538 near the bottom of the lower portion of the chamber body 501 and is configured to fill the lower chamber volume 539A with processing fluid. The inlet manifold 542 has a plurality of apertures 541 opening to the bottom of the lower chamber volume 539A. An inlet assembly 506 having a plurality of inlet ports 507 is connected to the inlet manifold 542. In one embodiment, the inlet manifold 542 includes a sloped upper edge 579 that is configured to allow bubbles that may form during introduction of the processing fluid to rise away from the plurality of aperture 541. Thus, any bubbles created during introduction of the processing fluid, and any excess liquid, may be collected by an overflow conduit 582 coupled to a drain port 580 on the inlet assembly 506. The conduit 582 may be coupled to the overflow member 513 or 512 as shown in order to collect any excess fluid from the inlet manifold 542 and to disperse the collected bubbles. Each of the plurality of inlet ports 507 may be connected with an independent fluid source (e.g., fluid delivery systems 40-42 in FIGS. 2 and 4) by a dedicated valve (not shown), such as sources for etching, cleaning, and DI water for rinsing, such that different fluids, or a combination of fluids, may be supplied to the lower chamber volume 539A for different processes.

As the processing fluid fills the lower chamber volume 539A and reaches the weir 517, the processing fluid overflows from the weir 517 to an overflow volume 513 formed at least partially by the overflow members 511 and 512. Fluid from overflow member 512 may be flowed to the overflow member 511 to a common collection point in the lower portion of overflow member 511. A plurality of outlet ports 514, configured to drain the collected fluid, may be formed on the overflow member 511. The plurality of outlet ports 514 may be connected to a pump system, and in one embodiment, each of the plurality of outlet ports 514 may form an independent drain path dedicated to a particular processing fluid. In one embodiment, each drain path may be routed to a negatively pressurized container to facilitate rapid removal, draining, and/or recycling of the processing fluid.

A drain assembly 508 may be coupled to the sidewall 538 near the bottom of the lower chamber volume 539A that is in fluid communication with the lower chamber volume 539A. The drain assembly 508 is configured to drain the lower processing volume 539A rapidly. In one embodiment, the drain assembly 508 has a plurality of drain ports 509, each configured to form an independent drain path dedicated to a particular processing fluid. Examples of fluid supply and drain configurations may be found in the description of FIGS. 9-10 of U.S. patent application Ser. No. 11/445,707, filed Jun. 2, 2006, which is incorporated by reference in its entirety.

In one embodiment of the processing chamber 30, a transducer assembly 515A is disposed behind or integral to a window 505 in the bottom wall 503. The transducer assembly 515A may be one or more megasonic transducers configured to provide megasonic energy to the lower processing volume 539A. The transducer assembly 515A may include a single transducer or an array of transducers, oriented to direct megasonic energy into the lower chamber volume 539A via the window 505. In another embodiment, a pair of transducer assemblies 515B, 515C, each of which may include a single transducer or an array of multiple transducers, are positioned behind or integral to windows 505 at an elevation below that of the weir 517, and are oriented to direct megasonic energy into an upper portion of lower chamber volume 539A. The transducer assemblies 515B and 515C are configured to direct megasonic energy towards a front surface and a back surface of a substrate, respectively, as the substrate is positioned in the lower chamber volume 539A, and may be actuated as the substrate passes through a liquid/vapor interface, generally indicated by a dashed line at 543. The addition of focused megasonic energy, as well as the controlled delivery of fluid to the substrate, will provide better substrate processing results, and substrate-to-substrate processing and cleanliness results, as opposed to substrates processed in a batch of multiple substrates.

As shown in FIG. 5, the opening 540 formed in the chamber lid 510 is configured to allow movement of the end-effector assembly 52 in and out the chamber body 501. The end-effector assembly 52 comprises a pair of rods 51 connected to a frame 527, which is coupled to an actuator assembly 50 (FIGS. 2-4) configured to move the end-effector assembly 52 relative to the chamber body 501. Each of the rods 51 have a substrate support assembly 51A which contains an end effector 529 that contains substrate supporting elements 530A, 530B. The substrate support assembly 51A may comprise an end effector 529 configured to receive and secure the substrate (not shown in this view) by an edge of the substrate.

In one embodiment, the chamber lid 510 includes one or more inlet plenums 520 and one or more exhaust plenums 518, which may be formed on each side of the opening 540. Each exhaust plenum may contain one or more exhaust ports 519. During processing, the lower chamber volume 539A may be filled with a processing liquid supplied from the inlet manifold 542, and the upper chamber volume 539B may be filled with a vapor coming in from the openings 521 disposed on the chamber lid 510. The liquid/vapor interface 543 may be created in the chamber body 501 by the introduction of the vapor from the openings 521. In one embodiment, the processing liquid fills up the lower chamber volume 539A and overflows from the weir 517, and the liquid/vapor interface 543 is located at substantially the same level as the upper portion of the weir 517.

Also, during processing, a substrate (not shown) being processed in the processing chamber 30 is first immersed in the processing liquid disposed in the lower chamber volume 539A, and then pulled out of the processing liquid. It is desirable that the substrate is free of the processing liquid after being pulled out of the lower chamber volume 539A. In one embodiment, the presence of a surface tension gradient on the substrate will naturally cause the liquid to flow away from regions of low surface tension, which may be referred to as the Marangoni effect, is used to remove the processing liquid from the substrate. The surface tension gradient may be created at the liquid/vapor interface 543. In one embodiment, an IPA vapor is used to create the liquid/vapor interface 543. When the substrate is being pulled out from the processing liquid in the lower chamber volume 539A, the IPA vapor condenses on the liquid meniscus extending between the substrate and the processing liquid, which facilitates a concentration of IPA in the meniscus, and results in the so-called Marangoni effect.

As described above, the volume of the processing chambers 30, specifically the lower chamber volume 539A of each processing chamber 30, are rapidly filled with processing fluids in less than about 10 seconds, for example, less than about 5 seconds, such as between about 2 seconds to about 3 seconds. In one embodiment, the lower chamber volume 539A may include a volume between about 1500 milliliters (mL) to about 2500 mL, for example, between about 1800 mL to about 2400 mL and may be filled in less than 3 seconds, such as between about 1.8 seconds to about 2.3 seconds. To facilitate the rapid filing of these volumes of the processing chamber 30, the fluid delivery system 42 may be enhanced with a chamber fill system 600 (FIG. 6).

Figure 6:
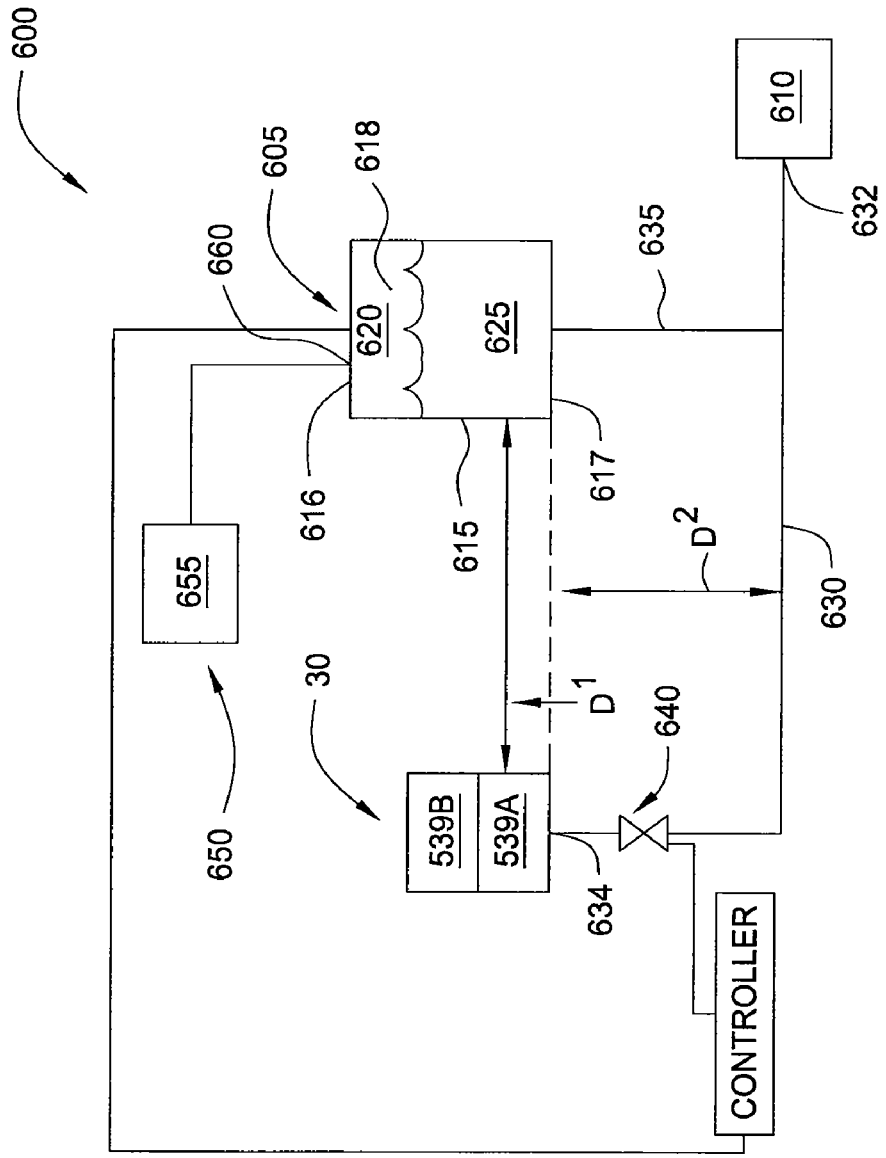
FIG. 6 is a schematic view of one embodiment of a chamber fill system.

FIG. 6 is a schematic view of one embodiment of a chamber fill system 600 that may be part of the tool 10 and may be used in connection with the fluid delivery system 42 of FIGS. 2-4. In one embodiment, the chamber fill system 600 provides enhanced input of fluids by enhancing the flow characteristics provided by a facility fluid source, such as a facility DI water source 610. For example, DI water from the facility DI water source 610 may have a lower pressure and/or flow rate than may be required to rapidly fill the processing chamber 30, and the chamber fill system 600 collects the DI water from the facility DI water source 610, using the available facility pressure and flow rate, in order to provide enhanced flow characteristics of DI water to the processing chamber 30 when needed. This enables existing facility pressures and flow rates to be enhanced for greater flow requirements than previously available from the facility source, which enables more efficient and/or improved processing. The increase in pressure and/or flow rate provided by the chamber fill system 600 also decreases cost of ownership (CoO) by enhancing the existing pressure and/or flow rate of facility fluids without the need to alter the facility source, such as by the addition of pumps and/or tanks to the facility source.

In an example, the chamber fill system 600 uses the facility source pressure and flow rate to charge a canister or tank 605 that is in fluid communication with the facility DI water source 610. A supply conduit 630 is coupled to the facility DI water source 610 at a first end 632 of the supply conduit 630, and a second end 634 of the supply conduit 630 is coupled to the processing chamber 30. The tank 605 is coupled to the supply conduit 630 between the facility DI water source 610 by a fill/drain conduit 635. In one embodiment, the fill/drain conduit 635 may be a single pipe or tube, or the fill/drain conduit 635 may be two distinct tubes having one tube for filling the tank 605 and one tube for draining the tank 605. A valve, such as a first valve 640 is coupled to the supply conduit 630 between the processing chamber 30 and the fill/drain conduit 635. The first valve may be coupled to a controller, which may be the controller 101 of FIG. 2.

In one embodiment, the tank 605 functions as a pressure vessel, which includes a bottom 617, sidewalls 615, and a lid 616 that contains an interior volume 618 and a head volume 620. Materials for the tank 605 include stainless steel, aluminum, polymers, plastics, and other suitable corrosion resistant materials. The tank 605 may be tubular in cross-section, rectangular in cross section, or any suitable tubular shape. In one embodiment, the sidewall 615 of the tank 605 is made of pipe or tube made of polyvinylidene fluoride (PVDF), and the lid 616 and bottom 617 are caps made of PVDF that are suitably joined and sealed with an adhesive or a solvent, or joined and sealed by bonding or welding. Suitable fittings are coupled to the tank 605 to facilitate filling and draining of the fluid contained therein, such as a fitting (not shown) coupled to the bottom 617 and the fill/drain conduit 635.

In operation, the first valve 640 is in a closed or "off" position and DI water from the facility DI water source 610 is flowed into the supply conduit 630, which provides DI water 625 into the interior volume 618 of the tank 605. As the DI water 625 fills the interior volume 618, a pressure is created in the head volume 620 above the DI water 625. The head volume 620 may include a pressure that is substantially equal to, or may be slightly less than, the pressure provided by the facility DI water source 610 as the DI water 625 accumulates in the tank 605. In one aspect, the DI water 625 may act to compress the head volume 620. If additional pressure in the head volume 620 is desired, an external pressure source, such as a fluid injection source 650, may be coupled to the tank 605 to provide a compressed fluid, for example compressed air, to the tank 605. However, compressing the DI water 625 to a pressure greater than the facility pressure may generate air bubbles in the DI water 625, and the bubbles may become entrained in the DI water 620 and be transferred to the processing chamber 30. Also, the additional pressurization may cause other challenges, such as backflow of the DI water 625. This may create a need for heavier plumbing and additional plumbing components, such as one-way valves.

When the DI water 625 reaches a desired level within the interior volume, the flow of DI water from the facility DI water source 610 may be stopped. Stopping the flow of DI water from the DI water source may be a function of pressure as the pressure in the head volume 620 may reach equilibrium with the pressure provided by the facility DI water source 610. Stopping the flow of DI water from the facility DI water source 610 may also include closing a valve (not shown) in the supply conduit 630 or integral to the facility DI water source 610 when the desired level is reached. In one embodiment, the desired level of DI water 625 may be defined by the volume needed to adequately fill or slightly overfill the lower chamber volume 539A of one or more processing chambers 30. In another embodiment, the desired level of DI water 625 may be defined and/or controlled by the pressure of the facility DI water source 610 and/or the pressure of the head volume 620, such that when the pressure of the facility DI water source 610 and the pressure of the head volume 620 are substantially equal, the DI water from the facility DI water source 610 ceases to flow. In either embodiment, the volume of the tank 605 is configured to include a head volume 620 and an ample amount of DI water 625 to fill or slightly overfill at least one lower chamber volume 539A in about three seconds or less. Additionally or alternatively, the facility DI water source 610 may be left open or "on" during processing and the flow is temporarily stopped when the desired level of DI water 625 is reached as mentioned above.

When the interior volume 618 includes a suitable volume of DI water 625 and the pressure of the head volume 620 is suitable, the DI water 625 may be used immediately or stored until it is needed. When desired, the controller opens the first valve 640 and the DI water 625 flows rapidly to the lower chamber volume 539A. Any excess DI water is collected by the overflow volume 513 (FIG. 5). After the lower chamber volume 539A is suitably filled or slightly overfilled, the facility DI water source 610 is adequate to provide any additional DI water at the existing pressure and flow rate of the facility source 610. Once the DI water is no longer needed in the processing chamber 30, the first valve 640 is closed and the tank 605 is filled again for subsequent processing. During this refilling time, the substrate may be further processed in the processing chamber 30, or is transferred out of the processing chamber and another substrate is transferred into the processing chamber 30. In this manner, throughput of the processing chamber 30 is not affected.

In some applications, the chamber fill system 600 may be coupled with a fluid injection system 650. The fluid injection system 650 includes a source 655 that is coupled to the tank 605. The source 655 may be coupled to the tank 605 at the lid 616 by a port 660 as shown, although the source 655 may be coupled to other portions of the fluid delivery system 600. The source 655 may include a fluid, such as a gas, that may be periodically flowed to the tank 605 as a purge or in a continuous stream. The source 655 may contain a liquid or a gas, such as air, helium, (He) argon, (Ar) nitrogen ($N_2$), among others. In one example, the source 655 includes nitrogen that may be used as an intermittent purging gas for the chamber fill system 600. For example, DI water is sometimes prone to bacteria, and to minimize or eliminate bacterial growth, the tank 605 and other portions of the plumbing may be purged with the nitrogen gas.

In one embodiment, the chamber fill system 600 includes one tank 605 per processing chamber 30, and the interior volume 618 of the tank 605 may be chosen to provide a desired volume of DI water to the lower chamber volume 539A of the processing chamber 30. In the case of one tank 605 per processing chamber 30, the interior volume 618 is configured to include a volume of DI water 625 that is substantially equal or slightly greater than the volume of DI water needed to fill the lower chamber volume 539A in less than about 3 seconds. In addition to the volume of DI water 625, the interior volume 618 also includes the head volume 620. Alternatively, the chamber fill system 600 includes one tank 605 for more than one processing chamber 30, and the interior volume 618 may be configured to include a volume of DI water 625 that is substantially equal or slightly greater than the volume of DI water needed by the lower chamber volume 539A of n processing chambers 30, wherein n is an integer greater than one. The interior volume 618 also includes the head volume 620 and the volume of DI water enables filling of the lower chamber volume 539A of n processing chambers in less than about 3 seconds. In this manner, the lower interior volume 539A of one or more processing chambers 30 chambers 30 may be provided with an ample volume of DI water with enhanced flow to enable a quicker fill time.

The location of the chamber fill system 600 may also be configured to enhance fluid flow and the location may be referred to as one or a combination of distances $D^1$ and $D^2$ between the processing chamber 30 and the tank 605. Distance $D^1$ may be any horizontal direction, such as in the X and Y direction, and distance $D^2$ may be a vertical direction, such as in the Z direction. One or a combination of distances $D^1$ and $D^2$ of the tank 605 relative to the processing chamber 30 may be configured to control flow characteristics, such as flow rate or velocity, to provide enhanced flow of DI water to the lower chamber volume 539A. For example, distances $D^1$ and $D^2$ may be chosen to minimize pressure losses due to, at least in part, frictional losses in the fill/drain conduit 635 and/or supply conduit 630. In experiments performed with the chamber fill system 600, it was discovered that the greater the distance (distances $D^1$ and/or $D^2$) of the tank 605 from the processing chamber 30, the rate of fill of the processing chamber 30 was less aggressive. Conversely, the closer the distance (distances $D^1$ and/or $D^2$) of the tank 605 to the processing chamber 30, the flow rate was more aggressive. The difference in fill rate was found to be caused, at least in part, by the length of plumbing between the processing chamber 30 and the tank 605, wherein factors such as friction may cause the flow to slow down relative to the length of the plumbing.

This pressure loss may be beneficial to control the fill rate of the processing chamber 30. For example, the distances $D^1$ and/or $D^2$ may be chosen to affect the flow rate from the tank 605 to slow down the flow rate or to minimize the magnitude of the flow. This, in turn, may minimize turbulence and/or the generation of bubbles, and may also decrease the velocity of the DI water as it enters the lower chamber volume 539A to minimize the possibility of dislodging the substrate from the end effector assembly 52 (FIG. 5). In order to slow down the flow rate of DI water, one or both of the distances $D^1$ and $D^2$ may be lengthened to place the tank 605 farther from the processing chamber 30. Conversely, the distances $D^1$ and/or $D^2$ may be shortened to facilitate a more aggressive flow rate of DI water to the processing chamber 30.

Figure 7:
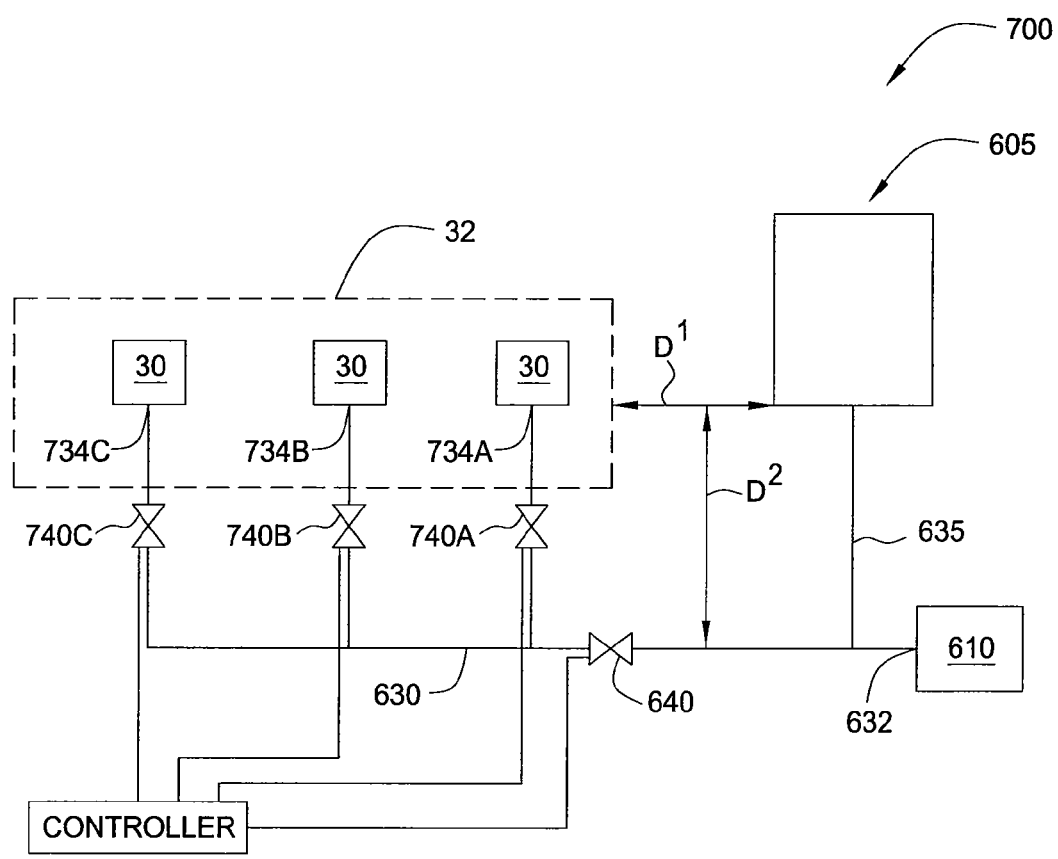
FIG. 7 is a schematic view of another embodiment of a chamber fill system.

FIG. 7 is a schematic view of another embodiment of a chamber fill system 700 that is coupled to a processing chamber array 32. In this embodiment, the supply conduit 630 is coupled at a first end 632 to the facility DI water source 610 and the supply conduit 630 includes three second ends 734A-734C coupled to a respective processing chamber 30 in the processing chamber array 32. The supply conduit 630 may include a first valve 640 and/or the supply conduit 630 may include a plurality of second valves 740A-740C that may operate alone or in combination with the first valve 640. All of the valves 640 and 740A-740C may be coupled to a controller, such as the controller 101 of FIG. 2.

In operation, the tank 605 accumulates DI water from the facility DI water source 610 as described above. Once the tank is filled with an adequate volume of DI water to fill or slightly overfill the lower processing volume (not shown in this view) of each processing chamber 30, the valve 640 may be opened to allow filling the lower processing volume of each processing chamber 30 in the processing chamber array 32. In this embodiment, if the second valves 740A-740C are used, the valves 740A-740C are opened to allow the DI water to flow from the tank 605 to each processing chamber 30. In an alternative embodiment, if only one processing chamber 30 is in need of DI water, one of the valves 740A-740C is opened for that a particular processing chamber 30 and the remaining valves from the group 740A-740C are closed. The first valve 640 is then opened and a suitable volume of DI water is flowed to the processing chamber 30 in need of DI water. The valve 640 may then be closed to stop the flow of DI water, or left slightly open wherein the flow of DI water is lessened and subsequently closed when no more DI water is needed. Other chambers 30 and associated valves 740A-740C may be operated similarly to supply DI water to one processing chamber 30, two processing chambers 30, or all of the processing chambers 30 in parallel. The location of the tank 605 may also be chosen to vary the DI water flow characteristics as described above.

While the foregoing is directed to embodiments of the present invention, other and further embodiments of the invention may be devised without departing from the basic scope thereof, and the scope thereof is determined by the claims that follow.

The invention claimed is:

1. A fluid delivery system for a semiconductor processing chamber located in a manufacturing facility, comprising:
   a supply conduit having a first end and a second end, and a valve between the first end and the second end, the first end coupled to a de-ionized water source provided by the manufacturing facility and the second end coupled to the processing chamber;
   a tank coupled to the supply conduit between the de-ionized water source and the processing chamber by a fill/drain conduit;
   a controller coupled to the valve; and
   a gas injection system coupled to the tank for supplying a purge gas.

2. A fluid delivery system for a semiconductor processing chamber located in a manufacturing facility, comprising:
   a supply conduit having a first end and a second end, and a valve between the first end and the second end, the first end coupled to a de-ionized water source provided by the manufacturing facility and the second end coupled to a processing chamber;
   a tank coupled to the supply conduit between the de-ionized water source and the processing chamber by a fill/drain conduit; and
   a controller coupled to the valve, wherein the tank and the processing chamber is coupled to a substrate cleaning/substrate surface preparation tool.

3. A fluid delivery system for a semiconductor processing system located in a manufacturing facility comprising:
   a supply conduit having a first end and a second end and a first valve between the first end and the second end, the first end coupled to a de-ionized water source provided by the manufacturing facility and the second end coupled to a processing chamber array;
   a tank coupled to the supply conduit between the de-ionized water source and the processing chamber array by a fill/drain conduit;
   a controller coupled to the valve; and
   a gas injection system coupled to the tank for supplying a purge gas.

4. A fluid delivery system for a semiconductor processing system located in a manufacturing facility comprising:
   a supply conduit having a first end and a second end and a first valve between the first end and the second end, the first end coupled to a de-ionized water source provided by the manufacturing facility and the second end coupled to a processing chamber array;
   a tank coupled to the supply conduit between the de-ionized water source and the processing chamber array by a fill/drain conduit; and
   a controller coupled to the valve, wherein the tank and the processing chamber array is coupled to a substrate cleaning/substrate surface preparation tool.

5. A fluid delivery system for a semiconductor processing system located in a manufacturing facility comprising:
   a supply conduit having a first end and a second end and a first valve between the first end and the second end, the first end coupled to a de-ionized water source provided by the manufacturing facility and the second end coupled to a processing chamber array;
   a tank coupled to the supply conduit between the de-ionized water source and the processing chamber array by a fill/drain conduit; and
   a controller coupled to the valve, wherein the processing chamber array includes three processing chambers and each of the processing chambers include a second valve disposed between the first valve and an inlet port.

6. A method of supplying a fluid to a substrate processing apparatus, comprising:
   providing a pressure vessel coupled to a facility fluid source;
   flowing a fluid from the facility fluid source to the pressure vessel;
   accumulating a volume of the fluid from the facility fluid source in the pressure vessel to form a pressure in a head volume above the fluid, the pressure substantially equal to a pressure of the facility fluid source; and
   opening a first valve by a signal from a controller to release at least a portion of the volume of fluid from the pressure vessel to one or more processing chambers located on the substrate processing apparatus.

7. The method of claim 6, wherein the fluid is de-ionized water.

8. The method of claim 6, wherein the volume of the fluid is substantially equal to or slightly greater than a lower chamber volume of one of the one or more processing chambers.

9. The method of claim 6, wherein the volume of the fluid is substantially equal to or slightly greater than a lower chamber volume of at least two processing chambers.

* * * * *